(12) United States Patent
Song et al.

(10) Patent No.: US 8,143,713 B2
(45) Date of Patent: Mar. 27, 2012

(54) CHIP-ON-BOARD PACKAGE

(75) Inventors: Eun-Seok Song, Hwaseong-si (KR);
YoungHoon Ro, Hwaseong-si (KR)

(73) Assignee: Samsung Electronics Co., Ltd.,
Gyeonggi-Do (KR)

( * ) Notice: Subject to any disclaimer, the term of this patent is extended or adjusted under 35 U.S.C. 154(b) by 215 days.

(21) Appl. No.: 12/662,268

(22) Filed: Apr. 8, 2010

(65) Prior Publication Data

US 2010/0270657 A1    Oct. 28, 2010

(30) Foreign Application Priority Data

Apr. 28, 2009  (KR) .................. 10-2009-0037088

(51) Int. Cl.
*H01L 23/48*  (2006.01)
*H01L 23/52*  (2006.01)
*H01L 27/10*  (2006.01)
*H01L 29/73*  (2006.01)
*H01L 29/40*  (2006.01)

(52) U.S. Cl. ........ 257/690; 257/203; 257/734; 257/784; 257/786; 257/E23.01; 257/E23.015

(58) Field of Classification Search .................. 257/203, 257/690, 734, 784, 786, E23.01, E23.015
See application file for complete search history.

(56) References Cited

U.S. PATENT DOCUMENTS

| | | | | | |
|---|---|---|---|---|---|
| 5,675,184 | A | * | 10/1997 | Matsubayashi et al. | 257/728 |
| 5,752,182 | A | * | 5/1998 | Nakatsuka et al. | 455/333 |
| 5,789,797 | A | * | 8/1998 | Ikuta et al. | 257/533 |
| 6,130,483 | A | * | 10/2000 | Shizuki et al. | 257/778 |
| 7,064,423 | B2 | | 6/2006 | Okita et al. | 257/679 |
| 7,129,589 | B2 | * | 10/2006 | Behzad | 257/786 |
| 7,164,197 | B2 | * | 1/2007 | Mao et al. | 257/700 |
| 7,355,862 | B2 | * | 4/2008 | Shirai et al. | 361/760 |
| 7,372,149 | B2 | * | 5/2008 | Yamamoto et al. | 257/728 |
| 2003/0020149 | A1 | * | 1/2003 | Ogura et al. | 257/678 |
| 2005/0007744 | A1 | | 1/2005 | Okita et al. | 361/728 |
| 2008/0308951 | A1 | * | 12/2008 | Li et al. | 257/778 |

FOREIGN PATENT DOCUMENTS

| | | |
|---|---|---|
| JP | 05-262081 | 10/1993 |
| JP | 2005-031917 | 2/2005 |
| KR | 10-2007-0077614 | 7/2007 |

* cited by examiner

*Primary Examiner* — Ida M Soward
(74) *Attorney, Agent, or Firm* — Harness, Dickey & Pierce, PLC

(57) ABSTRACT

Provided is a chip-on-board package. The chip-on-board package may include a board, a grounding pad on a first surface of the board, the grounding pad including a body portion and at least one line portion, and at least two conductive pads on the first surface, the at least two conductive pads being arranged adjacent to the body portion. The at least one line portion may extend between the at least two conductive pads and the at least one line portion may have a narrower width than the at least two conductive pads.

15 Claims, 10 Drawing Sheets

CHIP-ON-BOARD PACKAGE

CROSS-REFERENCE TO RELATED APPLICATIONS

This U.S. non-provisional patent application claims priority under 35 U.S.C. §119 to Korean Patent Application 10-2009-0037088, filed on Apr. 28, 2009, in the Korean Intellectual Property Office (KIPO), the entire contents of which are herein incorporated by reference.

BACKGROUND

1. Field

Example embodiments of inventive concepts relate to a chip-on-board package capable of reducing coupling between conductive pads.

2. Description of the Related Art

With the development of an information society, a demand for various kinds of information storing/processing devices has increased. The information storing/processing devices are being manufactured with a smaller size and are being used in various fields. Therefore, high density and miniaturization of semiconductor packages are being realized. Moreover, a Chip-On-Board (COB) package capable of mounting semiconductor chips directly on a printed circuit board has been introduced. Many small-sized devices have been manufactured using the aforementioned semiconductor packages. In these small-sized devices, terminals for receiving power or signals are often exposed to the outside.

SUMMARY

Example embodiments of inventive concepts provide a chip-on-board package capable of preventing or reducing coupling between terminals that may be externally exposed. Accordingly, a chip-on-board package in accordance with example embodiments of inventive concepts may realize improved reliability.

In accordance with example embodiments of inventive concepts, a chip-on-board package may include a board and a grounding pad on a first surface of the board. The grounding pad may include a body portion and at least one line portion. In accordance with example embodiments of inventive concepts, and at least two conductive pads may be on the first surface and the at least two conductive pads may be arranged adjacent to the body portion. In example embodiments of inventive concepts, the at least one line portion may extend between the at least two conductive pads and the at least one line portion may have a narrower width than the at least two conductive pads.

Example embodiments of inventive concepts provide a chip-on-board package that may include a board and a grounding pad disposed on a first surface of the board. The grounding pad may include a body portion and one or more line portions. In accordance with example embodiments of inventive concepts, conductive pads may be disposed on the first surface and arranged adjacent to the body portion. The line portions may extend between the adjacent conductive pads and may have a narrower width than the conductive pads.

In example embodiments of inventive concepts, the conductive pads may include one or more signal pads. Each of signal pads may include a first side facing the body portion and a second side facing the line portion, and the line portion may extend so as to shield the entire second side.

In example embodiments of inventive concepts, the conductive pads may further include one or more additional pads. One or more of the signal pads may face the additional pad and one or more of the line portions may be disposed between the signal pad and the additional pad.

In example embodiments of inventive concepts, each of the signal pads may further include a third side connected to the second side and being opposite to the first side. The grounding pad may further include a distal portion facing the third side. In accordance with example embodiments of inventive concepts, the distal portion may extend from the line portion.

In example embodiments of inventive concepts, the signal pads may be surrounded by the body portion, the line portions, and the distal portion.

In example embodiments of inventive concepts, the chip-on-board package may further include a chip disposed on a second surface opposite to the first surface of the board.

In example embodiments of inventive concepts, the chip-on-board package may further include a lower board facing a second surface opposite to the first surface of the board, a lower conductive pattern disposed on a surface of the lower board facing the second surface, and a chip mounted on a surface opposite to the surface on which the lower conductive pattern is disposed. The lower conductive pattern may electrically be connected to the grounding pad.

In example embodiments of inventive concepts, the chip-on-board package may further include a wire connecting the grounding pad to the lower conductive pattern via a first through-hole formed through the board and a second through-hole formed through the lower conductive pattern and the lower board. In this configuration, the first through-hole may expose the grounding pad, and the second through-hole may be aligned with the first through-hole.

In example embodiments of inventive concepts, the second through-hole may include pattern through-holes formed through the lower conductive patterns and lower through-holes formed through the lower board. One or more of the pattern through-holes may have a larger size than the lower through-holes.

BRIEF DESCRIPTION OF THE DRAWINGS

Example embodiments of inventive concepts will be more clearly understood from the following detailed description taken in conjunction with the accompanying drawings.

FIGS. 1 through 3 are plan views illustrating Chip-On-Board (COB) packages according to example embodiments of inventive concepts;

FIG. 4 is a sectional view taken along the line IV-IV' of FIG. 1;

FIG. 5 is a sectional view taken along the line V-V' of FIG. 2;

FIG. 6 is a flowchart schematically illustrating a method of manufacturing a Chip-On-Board (COB) package according to example embodiments of inventive concepts;

FIGS. 7 through 9 are plan views illustrating stacked Chip-On-Board (COB) packages according to example embodiments of inventive concepts;

FIG. 10 is a flowchart schematically illustrating a method of manufacturing a stacked Chip-On-Board (COB) package according to example embodiments of inventive concepts; and FIG. 11 is a perspective view illustrating a smart card including a chip-on-board package or a stacked Chip-On-Board package according to example embodiments of inventive concepts.

DETAILED DESCRIPTION

Figure 1:
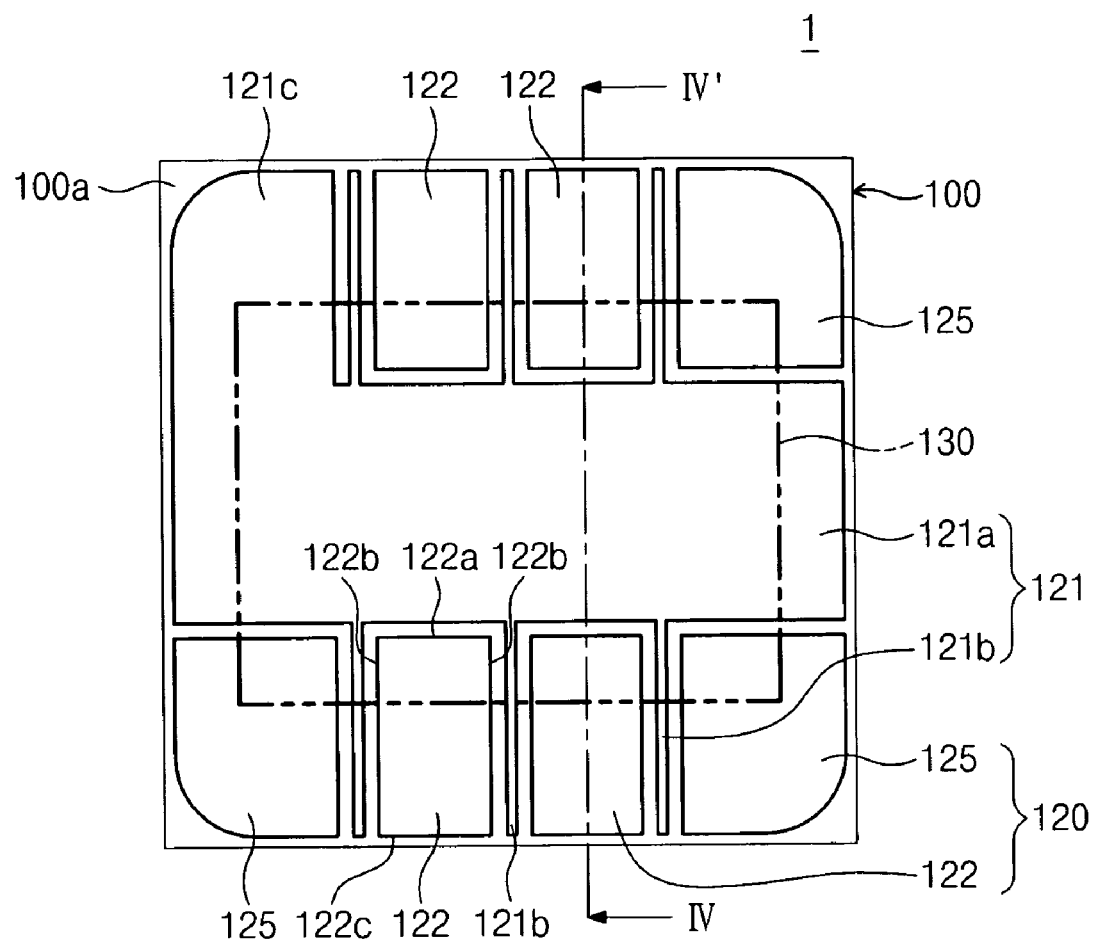
FIGS. 1-11 represent non-limiting, example embodiments of inventive concepts as described herein. In the drawings.

Example embodiments of inventive concepts will be described below with reference to the accompanying drawings. Objects, features, and advantages of the inventive concepts may be understood more readily by the accompanying drawings and the following detailed description of example embodiments of inventive concepts. The inventive concepts may, however, be embodied in many different forms and should not be construed as being limited to the embodiments set forth herein. Rather, example embodiments of inventive concepts are provided so that this disclosure will be thorough and complete and will fully convey the scope of the inventive concepts to those skilled in the art. Like reference numerals refer to like elements throughout the specification.

It will be understood that when any layers such as a conductive layer, a semiconductor layer, and an insulating layer are referred to as being "on" another material layer or substrate, they may be directly on the other material layer or substrate or intervening elements or layers may be present. In contrast, when an element is referred to as being "directly on," "directly connected to," or "directly coupled to" another element or layer, there are no intervening elements or layers present. It will be understood that, although the terms first, second, third etc. are used herein to describe various elements, these elements should not be limited by these terms. These terms are used to distinguish one element from another. Therefore, a first element mentioned in an embodiment may be mentioned as a second element in other embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

In the specification, it should be understood that the term "and/or" refers to one or all of elements mentioned before and after this term.

Referring to FIGS. 1 through 5, a chip-on-board package 1 according to example embodiments of inventive concepts will be described.

Figure 4:
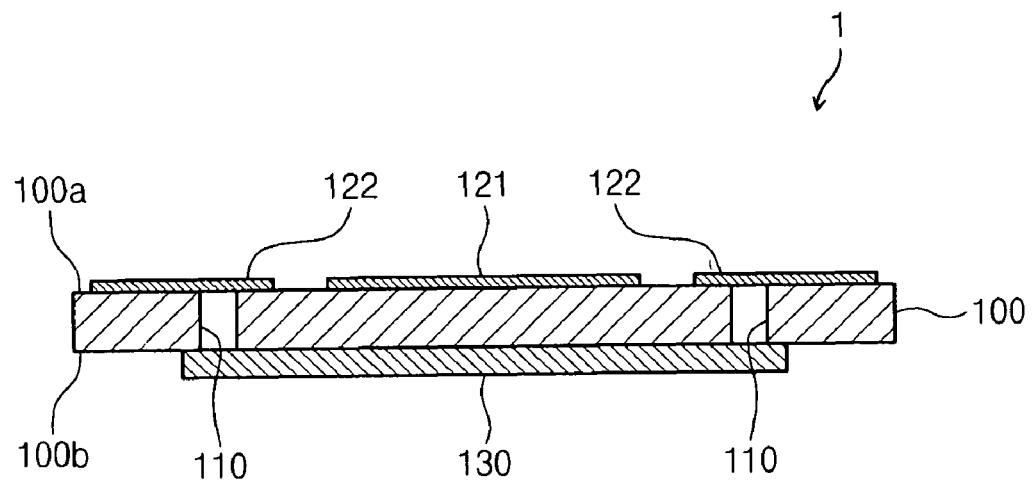
Figure 5:
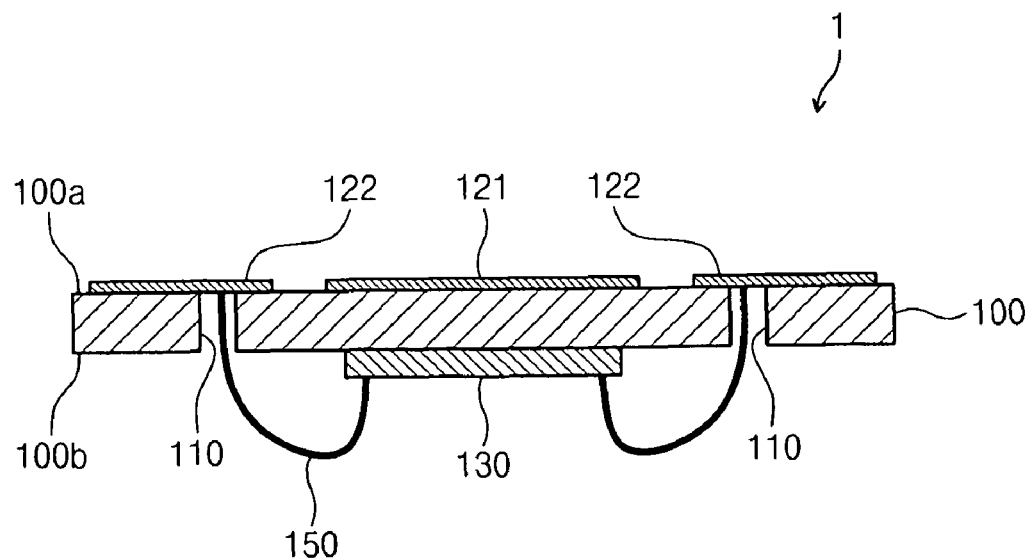

The chip-on-board package 1, according to example embodiments of inventive concepts, may include a board 100 having a top surface and a bottom surface. The board 100, for example, may be a printed circuit board. The top surface of the board 100 may have a terminal section 100a, in which external connection terminals are disposed whereas the bottom surface of the board 100 may have on a chip section 100b in which a chip is disposed. As shown in FIGS. 4 and 5, the terminal section 100a and the chip section 100b may be on opposite sides of the board 100. The terminal section 100a may include a plurality of conductive patterns disposed to be spaced apart from each other, and the chip section 100b may include an integrated circuit (IC) chip 130 disposed thereon.

Figure 2:
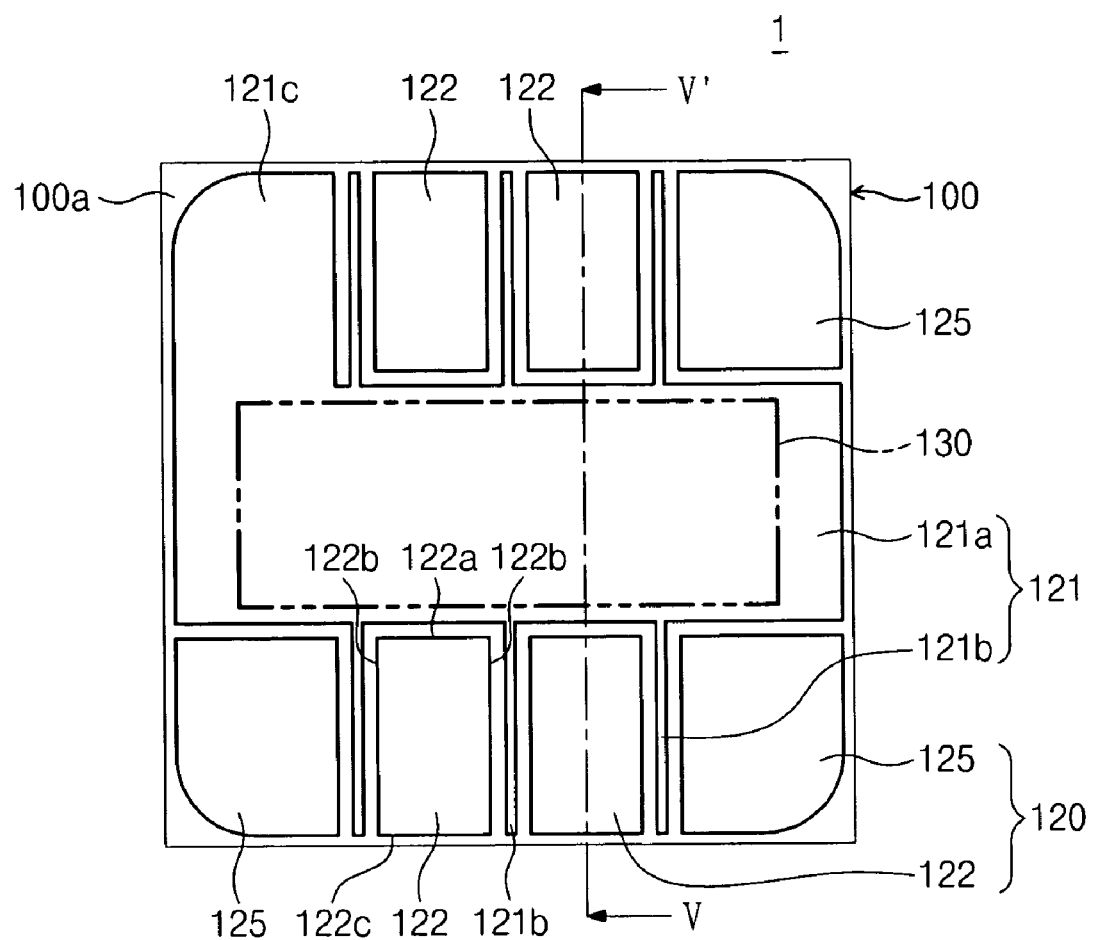
Figure 3:
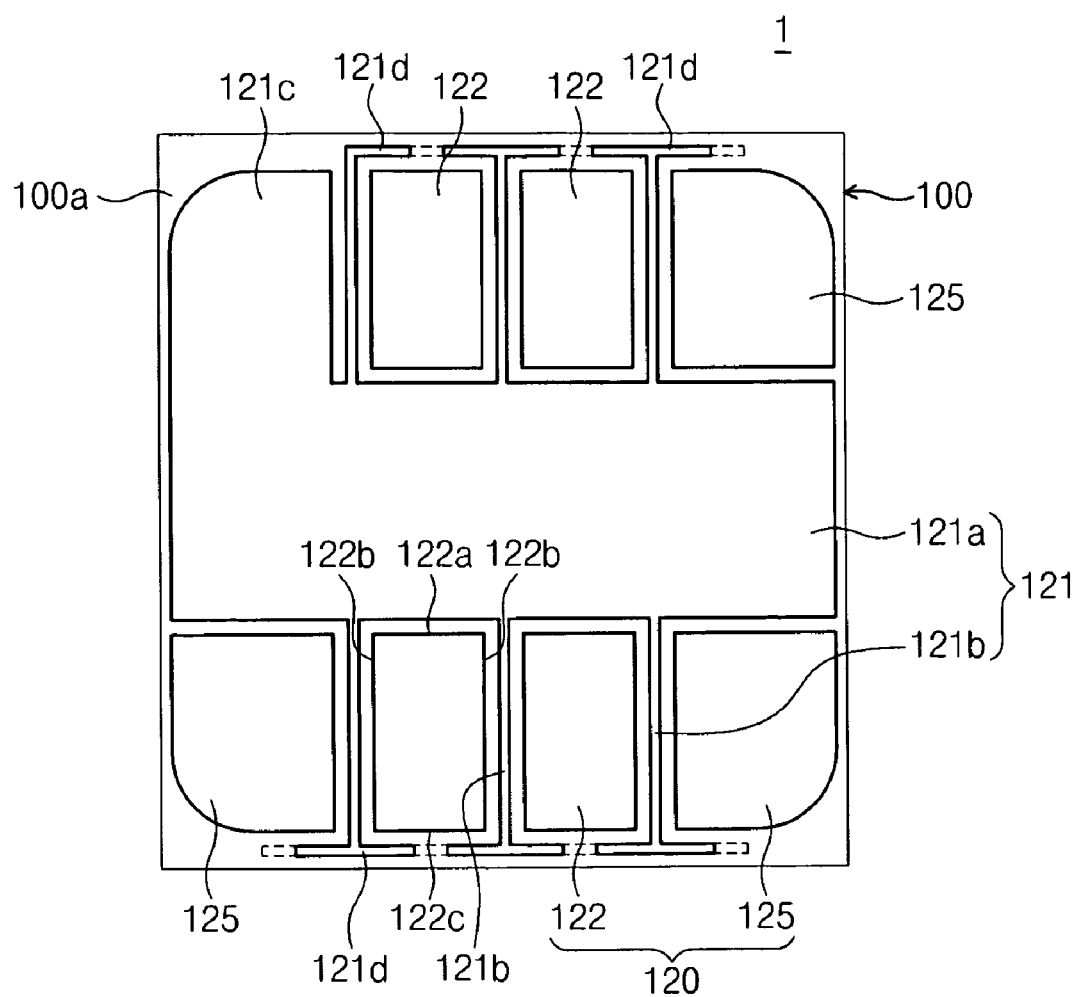

Referring to FIGS. 1 through 3, the terminal section 100a will be described.

Referring to FIGS. 1 and 2, the conductive patterns may include a grounding pad 121 and conductive pads 120 adjacent to the grounding pad 121. The conductive pads 120 may include one or more signal pads 122. The conductive pads 120 may further include additional pads 125. The additional pads 125 may be power pads and/or dummy pads. The dummy pads may be prepared to prevent or reduce damage to other conductive pads. All of the signal pads 122 and the additional pads 125 may be arranged adjacent to the grounding pad 121. The number of signal pads 122 may be increased or decreased, if necessary.

The grounding pad 121 may include the body portion 121a and one or more line portions 121b. The line portions 121b may extend outward from the body portion 121a. The line portions 121b may have a width narrower than that of the conductive pads 120. The line portions 121b may have a width smaller than the distance between the adjacent signal pads 122 and the distance between the signal pad 122 and the additional pad 125 adjacent to each other. This width refers to a distance in a minor axis direction. The line portions 121b may extend between other conductive pads 120 adjacent to the grounding pad 121. For example, the line portions 121b may extend between adjacent signal pads 122. The line portions 121b may partially extend between the signal pads 122 or may shield the whole of one side of the signal pads 122 facing the adjacent conductive pad. The line portions 121b may extend into a space between the signal pad 122 and the additional pad 125 adjacent to the signal pad 122. That is, the signal pads 122 may be arranged so as to be adjacent to another signal pad 122 with the line portion 121b interposed therebetween or may be arranged so as to be adjacent to the additional pad 125 with the line portion 121b therebetween.

Each of the signal pads 122 may include a first side 122a facing the body portion 121a, second sides 122b being connected with the first side 122a and extending outward from the body portion 121a, and a third side 122c being connected to the second sides 122b and opposite to the first side 122a. The second sides 122b may be shielded partially or wholly by the line portion 121b.

According to example embodiments of inventive concepts, the grounding pad 121 may include an extension portion 121c extending outward from the body portion 121a. The extension portion 121c may have a width broader than that of the line portion 121b. The extension portion 121c may have a width equal to or broader than that of the signal pad 122. The extension portion 121c may face the second side 122b of a signal pad 122. In example embodiments of inventive concepts, the line portion 121b may not be disposed between the extension portion 121c and the signal pad 122. That is, the extension portion 121c and the second side 122b of the signal pad 122 may directly face each other. Alternatively, the line portion 121b may be interposed between the extension portion 121c and the conductive pad.

Referring to FIG. 3, the grounding pad 121 may further include distal portions 121d extending from the line portions 121b. The distal portion 121d may extend so as to face the third side 122c of the signal pad 122. The distal portion 121d may extend so as to shield the entire third side 122c of the signal pad 122 or may extend so as to shield only a part of the third side 122c. According to example embodiments of inventive concepts, the signal pads 122 may be surrounded by the grounding pad 121. For example, the dashed lines illustrated in FIG. 3 may represent regions which may be occupied by the distal portions 121d to shield the entire third side 122c thus surrounding the ground signal pads 122.

The grounding pad 121 may be a single pattern made up of the body portion 121a, the extension portion 121c, and the line portions 121b. Alternatively, the grounding pad 121 may be a single pattern made up of the body portion 121a, the extension portion 121c, the line portions 121b, and the distal portions 121d.

The conductive pads 120 may be arranged on at least one side of the body portion 121*a* and may be arranged so as to surround the sides of the body portion 121*a*.

The chip section 100*b* will be described with reference to FIGS. 4 and 5.

An IC chip 130 may be disposed on the chip section 100*b* and the IC chip 130 may have various sizes.

Referring to FIGS. 1 and 4, the IC chip 130 may overlap the body portion 121*a* and may partially overlap the signal pads 122, the extension portion 121*c*, and the additional pads 125. In regions where the IC chip 130 is overlapped with the signal pads 122, the extension portion 121*c*, and the additional pads 125, the board 100 may have through-holes 110. The through-holes 110 may be filled with a conductive material to connect conductive pads (not illustrated) on the IC chip 130 to the conductive pads 120 of the board 100.

Referring to FIGS. 2 and 5, the IC chip 130 may overlap the body portion 121*a* without overlapping the signal pads 122, the extension portion 121*c*, and the additional pads 125. As shown in FIG. 5, the board 100 may include the plurality of through-holes 110. The through-holes 110 may be formed in the board 100 and in regions of the board 100 where the signal pads 122, the extension portion 121*c*, and the additional pads 125 are placed, so as to be adjacent to the body portion 121*a*. Wires 150 connected to the IC chip 130 may be connected to the signal pads 122, the extension portion 121*c*, and the additional pads 125 via the through-holes 110.

Figure 6:
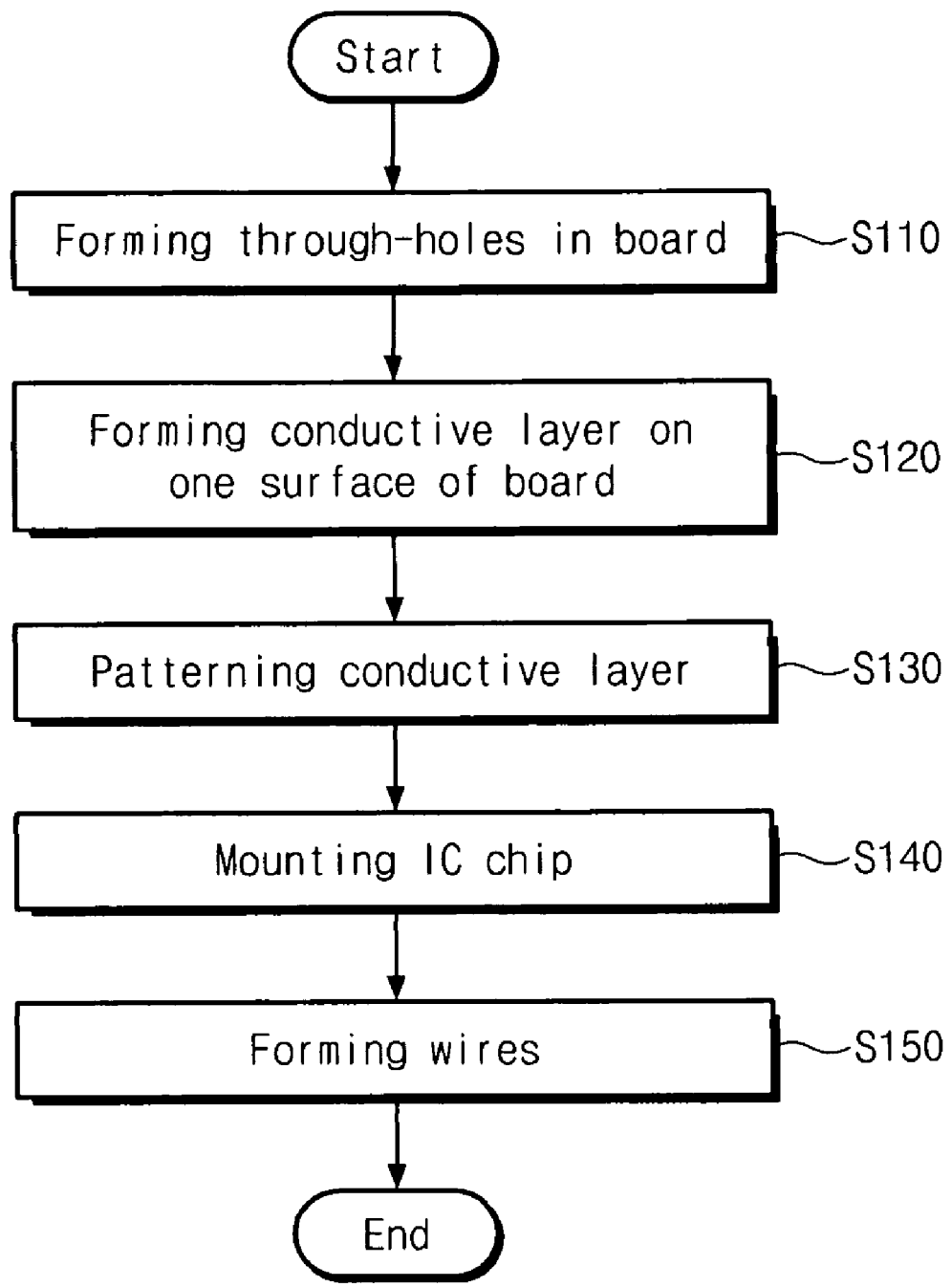

With reference to FIG. 6, a method of manufacturing a chip-on-board package according to example embodiments of inventive concepts will be described.

In accordance with example embodiments of inventive concepts, a stamping process may be performed on a board, for example, a printed circuit board, to form through-holes through the board (S110). The through-holes may penetrate the board and may be used as passages to connect conductive patterns that may be formed on a terminal section of the board to an IC chip that may be on a chip section of the board, wherein the chip section and the terminal section may be on opposite sides of the board and may be formed to face one another.

A conductive layer (for example, a copper layer) may be formed on a top surface of the board to form a terminal section (S120). According to example embodiments of inventive concepts, the conductive layer may or may not fill the through holes penetrating the board. For example, the conductive layer may be formed of a metal foil, accordingly, the metal layer may not fill the through-holes. Alternatively, the metal layer may be formed by plating so that the through-holes may be filled with the conductive layer. Although example embodiments of the inventive concepts describe forming a conductive layer on one surface of the board by plating or using a foil, example embodiments are not limited thereto as one skilled in the art would understand there are several methods of forming a metal layer on one surface of the board. Furthermore, example embodiments of inventive concepts are not limited to through holes that are filled or not filled with a conductive material. For example, inside surfaces of the through holes may be covered with a conductive material to electrically connect the top surface of the board to a bottom surface of the board without completely filling the through holes with a conductive material.

In accordance with example embodiments of inventive concepts, the conductive layer may be patterned to form the conductive patterns (S130). The conductive patterns may have the same shape and arrangement of those of the conductive patterns illustrated in FIGS. 1 through 3. For example, in this operation, the conductive pads 120 including the additional pads 125 and signal pads 122 may be formed. Additionally, this operation may also include forming the grounding pad 121 including the body portion 121*a* and the line portions 121*b*.

According to example embodiments of inventive concepts, an IC chip may be attached to a bottom surface of the board to form the chip section of the board (S140).

Additionally, according to example embodiments of inventive concepts, wires may be formed to connect the IC chip (S150) to the conductive patterns. For example, the wires may be formed to connect to the conductive patterns to the IC chip via the through-holes. Accordingly, the IC chip may be electrically connected to the conductive patterns by the wires passing through, contacting the through holes, or contacting a conductive material filling the through-holes.

The wires and the IC chip may be covered with an insulating material and thus may be protected.

According to a comparison example, a chip-on-board package was prepared in which signal pads are directly adjacent to each other without forming line portions and a signal pad is directly adjacent to an additional pad. A coupling capacitance between the adjacent conductive pads of the chip-on-board package including the line portions according to example embodiments of inventive concepts was measured. In addition, a coupling capacitance between the adjacent conductive pads of the chip-on-board package according to the comparison example was measured. In the chip-on-board package according to example embodiments of inventive concepts, and the comparison example, a distance between the adjacent signal pads or a distance between the signal pad and the additional pad adjacent to each other is the same. The coupling capacitance according to the comparison example was larger by about 20% to about 40% than the coupling capacitance of the chip-on-board package according to example embodiments of inventive concepts. In other words, the coupling capacitance between the signal pads in the case of having no line portion was larger than the coupling capacitance between the signal pads shielded by the line portions. That is, an ESD (Electro Static Discharge) noise between the adjacent conductive pads may be reduced by the line portions. Because the line portions are parts of the grounding pad, the ESD occurring between the adjacent pads may be removed or reduced using the line portions as a path.

A stacked chip-on-board package according to example embodiments of inventive concepts will be described with reference to FIGS. 7 through 9.

Figure 7:
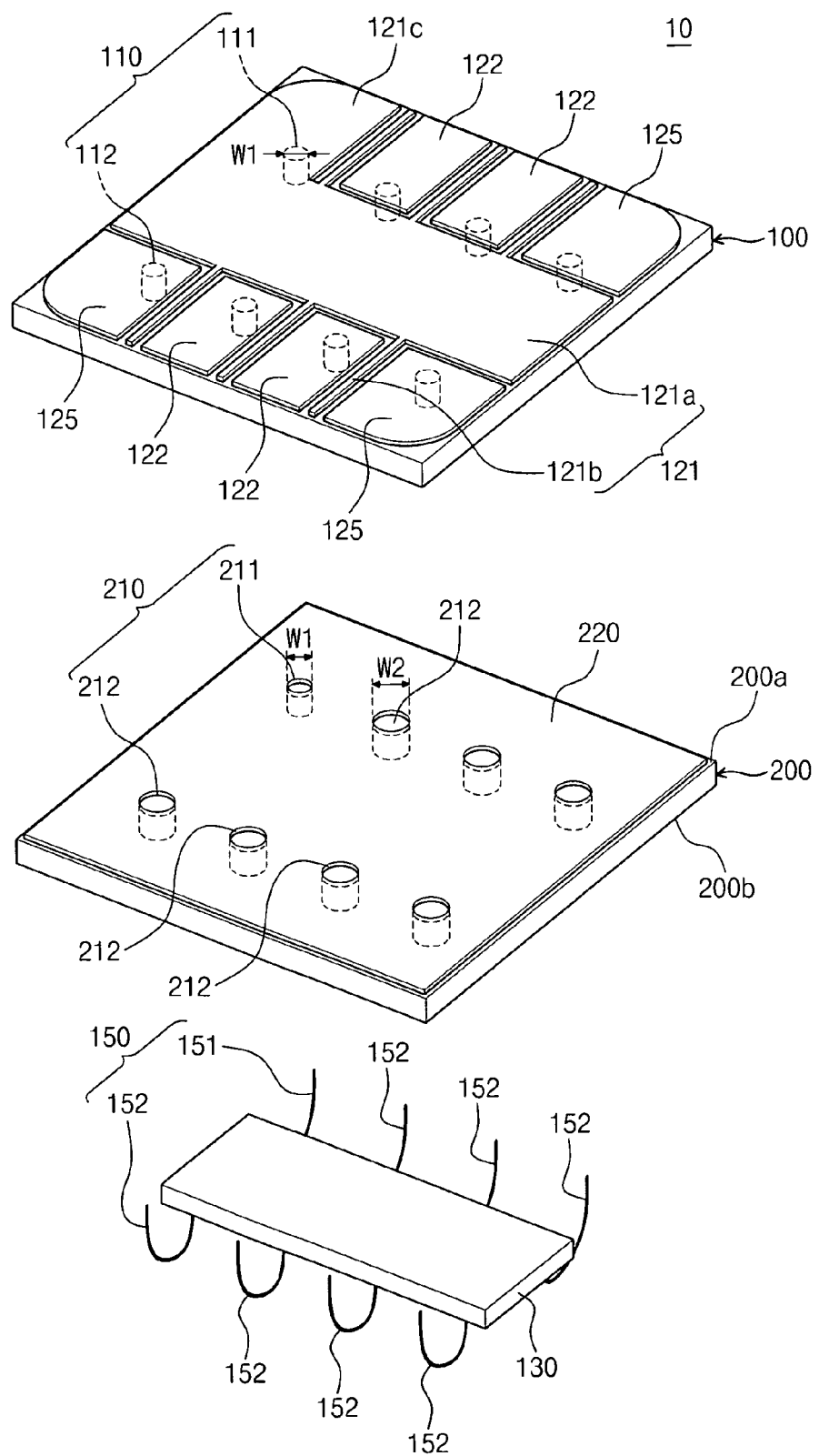

Referring to FIG. 7, a stacked chip-on-board package 10 may include a lower board 200 and an upper board 100 which may be sequentially stacked. The lower board 200 may include a first surface 200*a* and a second surface 200*b* facing in opposite directions. The first surface 200*a* may face the upper board 100, and an IC chip 130 may be disposed on the second surface 200*b*. A lower conductive pattern 220 may be disposed on the first surface 200*a*. The lower conductive pattern 220 may be a single pattern covering the entire first surface 200*a*. The lower conductive pattern 220 may be, for example, a conductive pad.

Upper conductive patterns may be disposed on the upper board 100. The upper conductive patterns may be spaced apart from the lower conductive pattern 220 of the lower board 200 with the upper board 100 interposed therebetween. The upper conductive patterns may include a grounding pad 121, signal pads 122, and/or additional pads 125, as described above. In example embodiments of inventive concepts, the surface of the board 100 facing the lower board 200 may not have a conductive pattern formed thereon.

The upper board 100 may include a plurality of upper through-holes 110 formed through the upper board 100. The upper through-holes 110 may include first upper through-holes 111 and second upper through-holes 112. The first upper through-holes 111 may be disposed at regions where the extension portions 121c of the grounding pad 121 are formed, and the second upper through-holes 112 may be formed in other regions. The second upper through-holes 112 may be disposed in the regions where the signal pads 122 and the additional pads 125 are formed, respectively. That is, the upper through-holes 110 may expose one surface of the upper conductive patterns.

The lower board 200 may include a plurality of lower through-holes 210 formed through the lower board 200. The lower through-holes 210 may be aligned with the upper through-holes 110. The lower through-holes 210 may include first lower through-holes 211 aligned with the first upper through-holes 111 and second lower through-holes 212 aligned with the second upper through-holes 112. The first lower through-hole 211 may have the same size W1 as that of the first upper though-hole 111. The second lower through-holes 212 may have the same size as that of the second upper through-holes 112, but may have a size W2 larger than that of the second upper through-holes 112. The lower through-holes 210 may be formed through the lower conductive pattern 220. That is, the lower through-holes 210 may be formed across the lower board 200 and the lower conductive pattern 220. Accordingly, inner walls of the lower through-holes 210 may be made up of the lower board 200 and the lower conductive pattern 220.

In example embodiments of inventive concepts, the grounding pad 121 may be connected to the lower conductive pattern 220 via the first upper through-hole 111. For example, the first upper through-hole 111 may be filled with a conductive material such that when the lower board 200 is attached to the upper board 100, the conductive material filling the first upper through-hole 111 contacts the lower conductive pattern 220. Thus, the lower conductive pattern 220 may be electrically connected to the grounding pad 121a via the first upper through-hole 111. However, example embodiments are not limited thereto. For example, internal surfaces of the first upper through-hole 111 may be plated with a conductive material which may serve to electrically connect the lower conductive pattern 220 to the grounding pad 121a.

Wires 150 may be connected to external pads (not illustrated) of the IC chip 130 and the IC chip 130 may be disposed on the second surface 200b of the lower board 200. The wires may be connected to the upper conductive patterns, for example, the signal pads 122, the grounding pad 121, and the additional pads 125, via the lower through-holes 210 and the upper through-holes 110, respectively. The wires 150 may include first wires 151 passing through the first lower through-holes 211 and second wires 152 passing through the second lower through-holes 212. In example embodiments of inventive concepts, sidewalls of the second lower through-holes 212 may not come into contact with the second wires 152. That is, the second wires 152 may be connected only to the signal pads 122 and the additional pads 125. The first wires 151, however, may come into contact with the side walls of the first lower through holes 211 to electrically connect to the lower conductive pattern 220. For example, the first lower through-holes 211 may be filled or plated with a conductive material and the first wires 151 may come into contact with the conductive material filling or plating the side walls of the first lower through-holes 211 to electrically connect the IC chip 130 to the lower conductive pattern 220.

Figure 8:
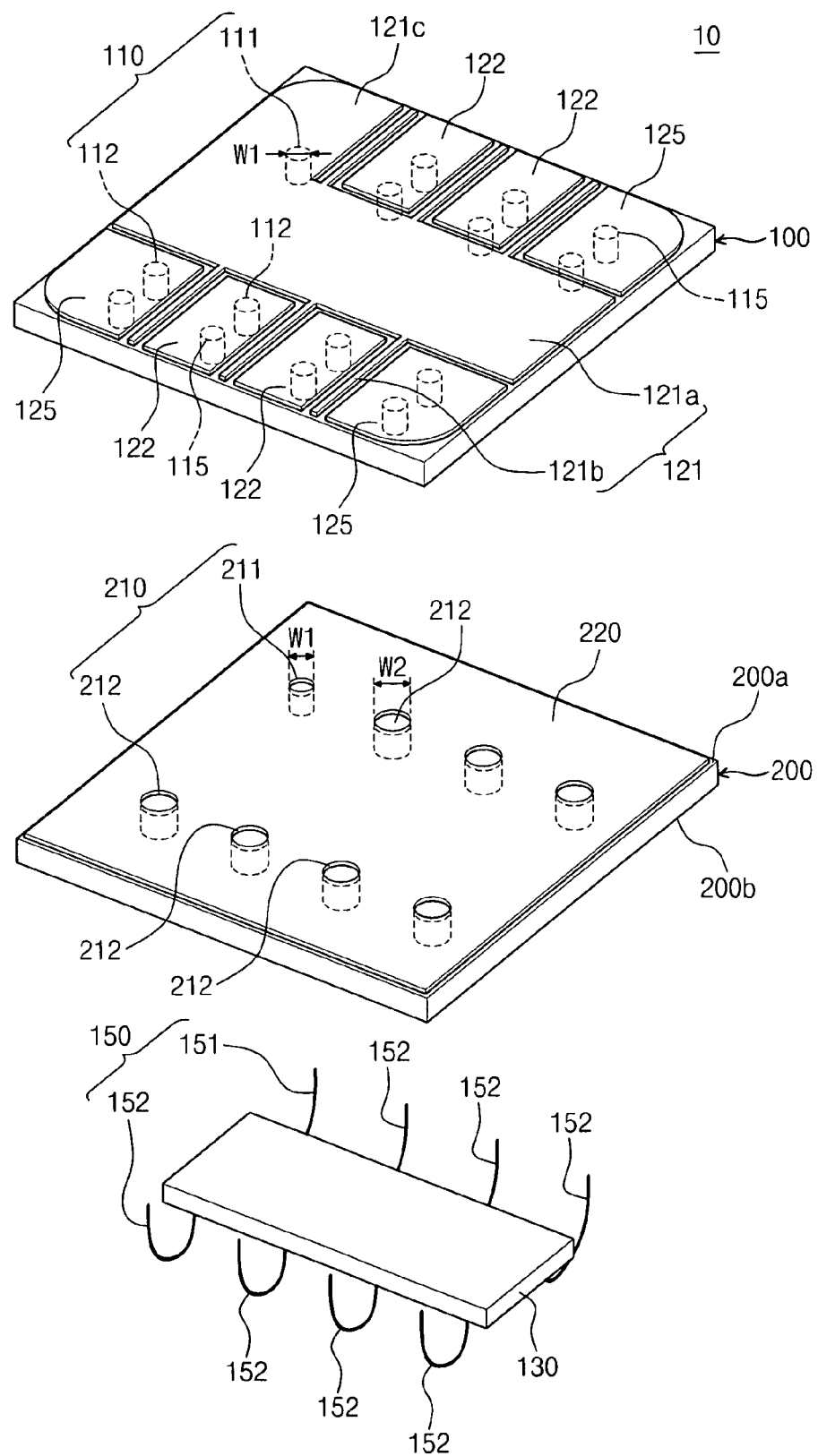

Referring to FIG. 8, the upper board 100 may further include additional through-holes 115. The additional through-holes 115 may be formed in the regions where the signal pads 122 and the additional pads 125 are formed. The signal pads 122 and the additional pads 125 may directly face the lower conductive pattern 220 via the additional through-holes 115. In other words, the additional through-holes 115 may be formed only through the upper board 100. One end of the additional through-holes 115 may be closed by the upper conductive patterns, for example, the signal pads 122 and the additional pads 125, and the other end of the additional through-holes 115 may be closed by the lower conductive pattern 220. At least one of the additional through-holes 115 may be arranged in the board 100 of the respective regions where the signal pads 122 and the additional pads 125 are formed. Since the lower conductive pattern 220 may be connected to the grounding pad 121, an ESD occurring between the adjacent pads may be removed or reduced using the lower conductive pattern 220 as a path. Coupling between the signal pads 122 may be reduced more by the additional through-holes 115.

Figure 9:
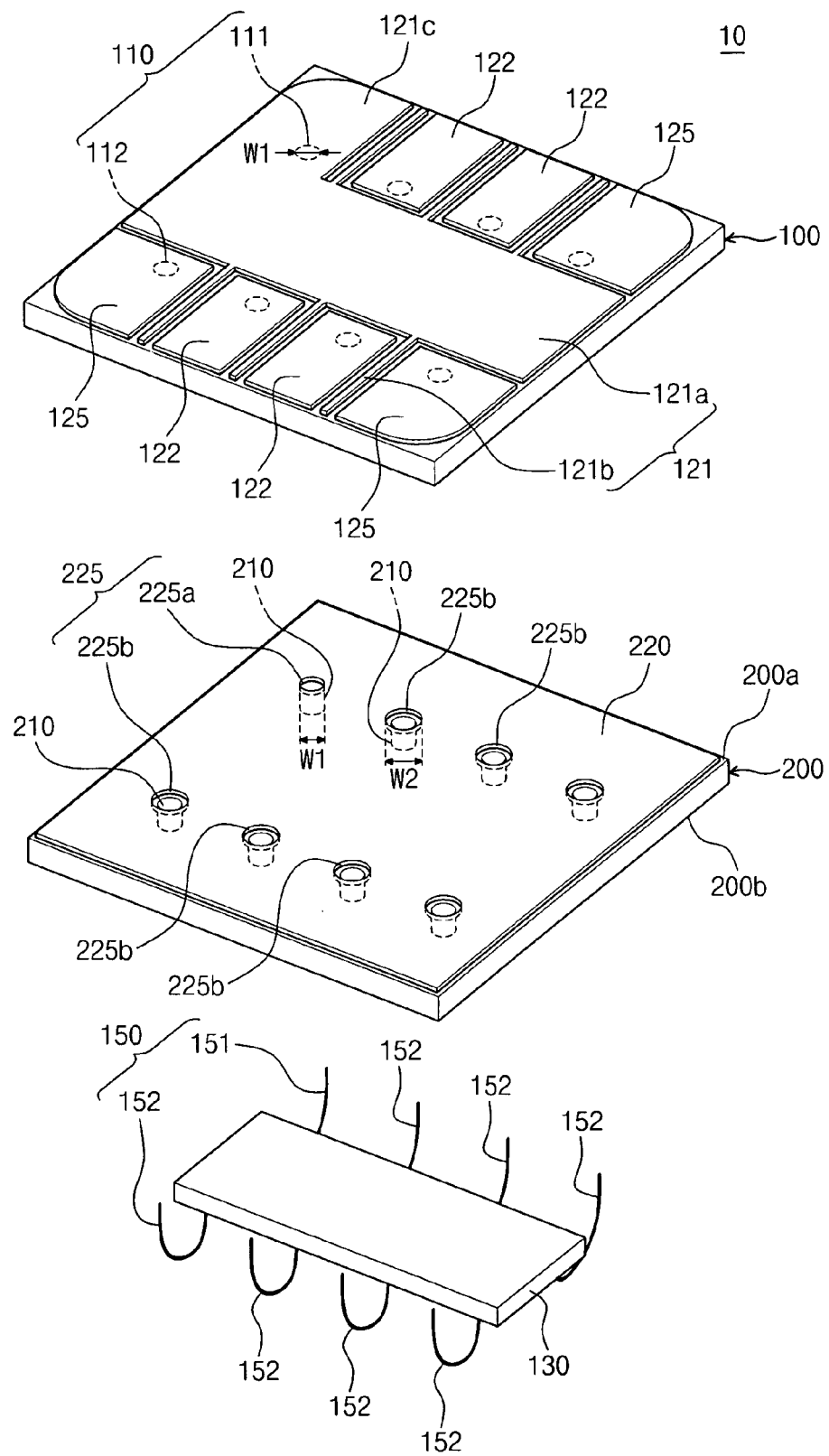

Referring to FIG. 9, the lower board 200 may include a plurality of lower through-holes 210 formed through the lower substrate 200. The lower through-holes 210 may be aligned with the upper through-holes 110. The lower through-holes 210 may have the same size W1 as that of the upper through-holes 110.

The lower conductive pattern 220 may include pattern through-holes 225 aligned with the lower through-holes 210. The pattern through-holes 225 may include first pattern through-holes 225a aligned with the first upper through-holes 111 and second pattern through-holes 225b aligned with the second upper through-holes 112. In example embodiments of inventive concepts, the first pattern through-hole 225a may have the same size of that of the lower through-hole 210 and the first pattern through-hole 225a may be aligned so as to have the same inner wall size W1 as the lower through-hole 210. However, example embodiments of inventive concepts are not limited thereto. For example, the second pattern through-holes 225b may have a size W3 larger than that of the lower through-holes 210 and may therefore expose the all of the lower through-holes 210.

Wires 150 may be connected to external pads (not illustrated) of the IC chip 130 that may be disposed on the second surface 200b of the lower board 200. The wires 150 may be connected to the upper conductive patterns, for example, the grounding pad 121, the signal pads 122, and the additional pads 125, via the lower through-holes 210, the pattern through-holes 225, and the upper through-holes 110, respectively. The wires 150 may include first wires 151 passing through the first pattern through-holes 225a and second wires 152 passing through the second pattern through-holes 225b. In example embodiments of inventive concepts, since the second pattern through-holes 225b may have an opening larger than that of the lower through-holes 210, the second pattern through-holes 225b may not come into contact with the second wires 152. That is, the second wires 152 may be connected only to the signal pads 122 and the additional pads 125. However, in example embodiments of inventive concepts the first wires 151 may come into contact with sidewalls of the first pattern through-holes 225a to electrically connect the lower conductive pattern 220 to the IC chip 130 and the first pattern through-holes 225a may be plated or filled with a conductive material.

Figure 10:
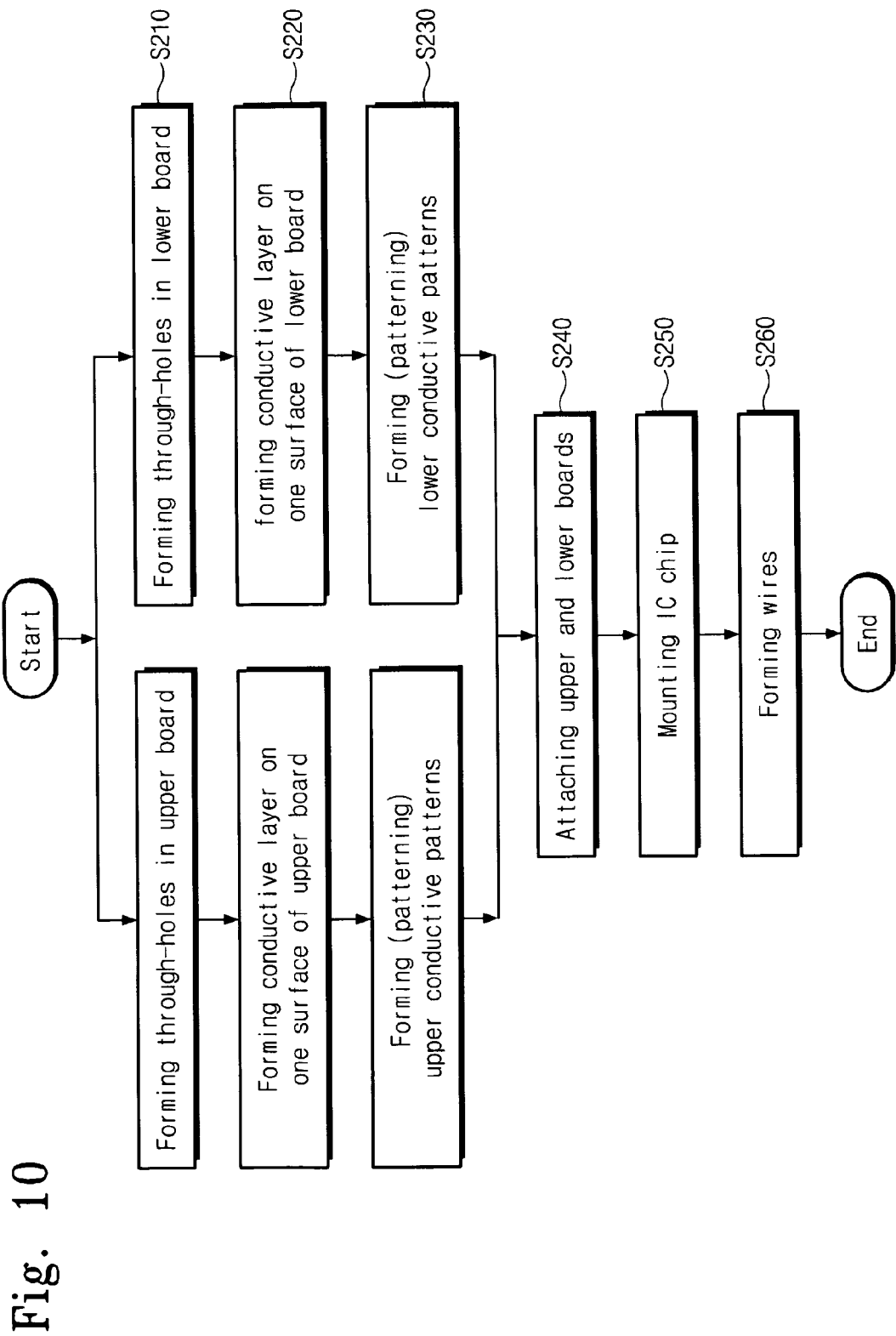

Referring to FIG. 10, a method of manufacturing the chip-on-board package according to example embodiments of inventive concepts will be described.

In accordance with example embodiments of inventive concepts, upper and lower boards may be prepared. The upper and lower boards may be subjected to a stamping process, so that through-holes may be formed in the upper and lower boards (S210). The through-holes of the upper board and the through-holes of the lower board may be formed, as illustrated in FIGS. 7 and 8.

A conductive layer (for example, a copper layer) may be formed in each one surface of the upper and lower boards (S220). According to example embodiments of inventive concepts, since the conductive layers may be formed of a metal foil, no metal layer may be formed in the through-holes.

The conductive layers may be patterned to form the conductive patterns on one surface of the upper board and to form the lower conductive pattern on one surface of the lower board (S230). The upper conductive patterns may have the same shape and arrangement as those of the conductive patterns illustrated in FIGS. 1 through 3 or 7 through 9. The lower conductive pattern may have the same shape as that illustrated in FIGS. 7 through 9.

The upper board on which the conductive patterns are formed may be attached to the lower board (S240). In example embodiments of inventive concepts, the surface on which the lower conductive pattern is formed may be attached so as to face one surface of the upper board on which the upper conductive patterns are not formed. The through-holes of the upper and lower boards may be formed to align with each other.

The IC chip may be attached to a surface of the lower board opposite to one surface of the lower board on which the lower conductive pattern is formed (S250).

Wires may be formed on the IC chip (S260) and may be formed to connect the upper conductive patterns to the IC chip via the upper through-holes and the lower through-holes. Accordingly, the IC chip may be electrically connected to the upper conductive patterns by the wires. However, the through-holes of the lower board through which the wires connected to the grounding pad of the upper board pass may be filled with a conductive material. For example, a filling process may be performed by soldering.

Additionally, the wires and the IC chip may be covered with an insulating material for protection.

Coupling between the adjacent signal pads or between the signal pad and the additional pad may be further reduced or minimized by the lower conductive pattern. That is, an ESD (Electro Static Discharge) noise between the adjacent conductive pads may be reduced by the lower conductive pattern. The lower conductive pattern may be connected to the grounding pad, and thus the ESD occurring between the adjacent pads may be removed or reduced using the lower conductive pattern as a path.

Figure 11:
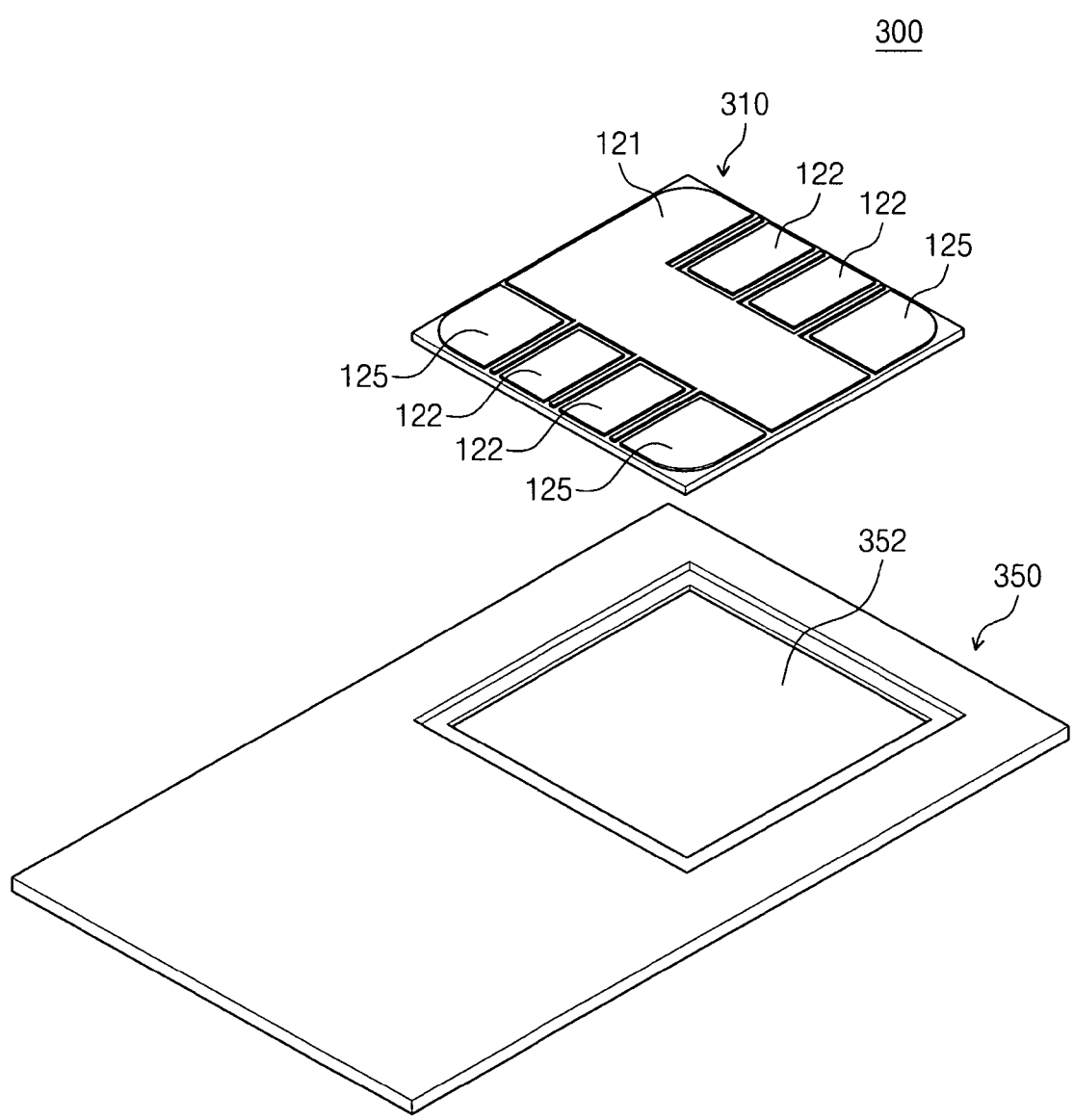

Referring to FIG. 11, a smart card including the chip-on-board package according to example embodiments of inventive concepts will be described.

A smart card 300 may include a chip-on-board package 310 and a base board 350. The chip-on-board package 310 may be a chip-on-board packages (or the stacked chip-on-board package) according to example embodiments of inventive concepts. The chip-on-board package 310 may be mounted on the base board 350 so that the IC chip 130 of the chip-on-board package 310 faces the base board 350. In example embodiments of inventive concepts, the base board 350 may include a groove 352 on which the chip-on-board package 310 is mounted. The groove 352 may have a profile corresponding to the mounted surface of the chip-on-board package 310. The chip-on-board package 310 may be mounted on the base board 350 so that the conductive patterns of the chip-on-board package 310 are exposed. The chip-on-board package 310 may be attached to the base board 350 by an adhesive tape (for example, a hot melt tape).

The groove 352 may have a plane area capable of inserting the chip-on-board package 310 and may have the same height as the entire height of the chip-on-board package 310.

According to example embodiments of inventive concepts, the coupling between the adjacent terminals may be reduced by interposing the line portions extending from a grounding pad between the external terminals of the package. Accordingly, defects or the like of the IC chip in the COB package may be reduced or minimized. Moreover, because the packages may include the lower board, which may include the lower conductive pattern connected to the grounding pad, below the upper board on which the external connection terminal is disposed, the coupling between the adjacent terminals on the upper board may be reduced or minimized by the lower conductive pattern.

The above detailed description explains example embodiments of inventive concepts. Inventive concepts covers various other combinations, modifications, and other embodiments and may be modified or changed within the scope of inventive concept disclosed in the specification, the scope equivalent to the described disclosure, and/or the techniques or knowledge scope of the art. Therefore, the detailed description of example embodiments of the inventive concepts is not intended to limit the inventive concepts. Moreover, the appended claims should be understood to include other embodiments.

What is claimed is:

1. A chip-on-board package comprising:
    a board;
    a grounding pad on a first surface of the board, the grounding pad including a body portion and at least one line portion; and
    at least two conductive pads on the first surface, the at least two conductive pads being adjacent to the body portion, wherein the at least one line portion extends between the at least two conductive pads and the at least one line portion has a narrower width than the at least two conductive pads.

2. The chip-on-board package of claim 1, wherein the at least two conductive pads includes at least one signal pad, the at least one signal pad includes a first side facing the body portion and a second side facing the at least one line portion, and the at least one line portion extends to shield the entire second side.

3. The chip-on-board package of claim 2, wherein the at least two conductive pads further includes at least one additional pad, and the at least one signal pad faces the at least one additional pad and the at least one line portion is between the at least one signal pad and the at least one additional pad.

4. The chip-on-board package of claim 2, wherein
    the at least one signal pad further includes a third side connected to the second side and being opposite to the first side, and
    the grounding pad further includes a distal portion facing the third side, the distal portion extending from the at least one line portion.

5. The chip-on-board package of claim 4, wherein the at least one line portion includes a first line portion and a second line portion, and the at least one signal pad is surrounded by the body portion, the first line portion, the second line portion, and the distal portion.

6. The chip-on-board package of claim 1, further comprising:
a chip on a second surface of the board, the second surface being opposite to the first surface of the board.

7. The chip-on-board package of claim 6, wherein the board includes through holes below the at least two conductive pads.

8. The chip-on-board package of claim 7, wherein the chip overlaps the grounding pad, the at least two conductive pads, and the at least one line portion.

9. The chip-on-board package of claim 8, wherein the through holes are between the at least two conductive pads and the chip.

10. The chip-on-board package of claim 9, wherein the through holes include a conductive material to electrically connect the at least two conductive pads to the chip.

11. The chip-on-board package of claim 8, wherein the chip overlaps the grounding pad.

12. The chip-on-board package of claim 9, further comprising:
a plurality of wires connecting the chip to the at least two conductive pads, wherein the through holes expose the at least two conductive pads and the wires contact the at least two conductive pads via through holes formed below signal pads.

13. The chip-on-board package of claim 1, further comprising:
a lower board facing a second surface of the board, the second surface of the board being opposite to the first surface of the board;
a lower conductive pattern on a surface of the lower board facing the second surface; and
a chip on a surface of the lower board opposite to the surface on which the lower conductive pattern is on,
wherein the lower conductive pattern is electrically connected to the grounding pad.

14. The chip-on-board package of claim 13, further comprising:
a wire connecting the grounding pad to the chip via a first through-hole extending through the board and a second through-hole extending through the lower conductive pattern and the lower board,
wherein the first through-hole exposes the grounding pad and the second through-hole is aligned with the first through-hole.

15. The chip-on-board package of claim 14, wherein the second through-hole includes a pattern through-hole extending through the lower conductive pattern and a lower through-hole extending through the lower board, and the pattern through-hole has a larger size than the lower through-hole.

* * * * *